US00RE38098E

(19) United States
(12) Reissued Patent
Herzer

(10) Patent Number: US RE38,098 E
(45) Date of Reissued Patent: Apr. 29, 2003

(54) MAGNETO-ELASTICALLY EXCITABLE TAG HAVING A RELIABLE DEACTIVATABLE AMORPHOUS ALLOY FOR USE IN A MECHANICAL RESONANCE MONITORING SYSTEM

(75) Inventor: Giselher Herzer, Bruchkoebel (DE)

(73) Assignee: Vacuumschmelze GmbH, Hanau (DE)

( * ) Notice: This patent issued on a continued prosecution application filed under 37 CFR 1.53(d), and is subject to the twenty year patent term provisions of 35 U.S.C. 154(a)(2).

(21) Appl. No.: 09/212,334

(22) Filed: Dec. 15, 1998

Related U.S. Patent Documents

Reissue of:
(64) Patent No.: 5,728,237
Issued: Mar. 17, 1998
Appl. No.: 08/762,044
Filed: Dec. 9, 1996

(30) Foreign Application Priority Data

Dec. 7, 1995 (DE) ..... 195 45 755

(51) Int. Cl.[7] ..... H01F 1/053
(52) U.S. Cl. ..... 148/304; 148/307; 148/310; 148/311; 148/312; 148/315; 420/459; 420/117; 420/581
(58) Field of Search ..... 148/304, 403, 148/307, 310, 311, 312, 315; 420/459, 117, 581

(56) References Cited

U.S. PATENT DOCUMENTS 4,510,490 A * 4/1985 Anderson et al. ..... 148/304
4,980,670 A * 12/1990 Humphrey et al. ..... 148/304
5,114,503 A * 5/1992 Yoshizawa et al. ..... 148/304
5,628,840 A * 5/1997 Hasegawa ..... 148/304

FOREIGN PATENT DOCUMENTS

WO WO 90/03652 * 5/1990

* cited by examiner

*Primary Examiner*—John Sheehan
(74) *Attorney, Agent, or Firm*—Schiff Hardin & Waite

(57) ABSTRACT

Amorphous alloys having the formula $$Fe_a\ Co_b\ Ni_c\ Si_x\ B_y\ M_z$$

are employed as monitoring strips for mechanically oscillating tags, for example for anti-theft protection, together with a source of a pre-magnetization field in which the strip is disposed so as to place the strip in an activated state. In the formula, M denotes one or more elements of groups IV through VII of the periodic table, including C, Ge and P, and the constituents in at % meet the following conditions: a lies between 20 and 74, b lies between 4 and 23, c lies between 5 and 50, with the criterion that b+c>14, x lies between 0 and 10, y lies between 10 and 20, and z lies between 0 and 5 with the sum x+y+z being between 12 and 21. These alloys have a resonant frequency associated therewith and when passed through an alternating field whose alternation frequency coincides with the resonant frequency, a pulse having a signal amplitude is produced. These alloys can be deactivated by removing the pre-magnetization field, which causes a change in the resonant frequency and the resulting signal amplitude. These alloys exhibit a change in resonant frequency and signal amplitude due to changes in the orientation of the tag in the earth's magnetic field which is smaller than the change occurring upon removal of the pre-magnetization field, so that the tag can be reliably deactivated.

13 Claims, No Drawings

MAGNETO-ELASTICALLY EXCITABLE TAG HAVING A RELIABLE DEACTIVATABLE AMORPHOUS ALLOY FOR USE IN A MECHANICAL RESONANCE MONITORING SYSTEM

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention is directed to the employment of an amorphous, magnetostrictive alloy in monitoring or identification systems for producing magneto-elastic tags that can be deactivated by removing a pre-magnetization field.

2. Description of the Prior Art

Magneto-elastically excitable tags usually contain monitoring strips that are composed of an amorphous alloy with high magnetostriction. PCT Application WO 90/03652 discloses the employment of amorphous alloys containing nickel in addition to iron for monitoring systems with mechanical resonance.

Alloys with magnetostrictive properties can be employed, for example, in identification systems for tags. The magnetostriction is exploited in order to place a strip of this alloy into oscillation by means of an alternating field acting on this strip. When the alternating field is deactivated, the strip, which continues to oscillate, generates magnetic field changes that a pick-up coil converts into induced voltage pulses. An evaluation of these voltage pulses reveals whether a strip of the oscillating material having a specific strip length is contained in the field.

An item can thus be identified by applying a strip of a particular length thereto, the length serving as an identifier, or an anti-theft security system can also be based on this principle, whereby only magnetized strips of a specific length are attached to the goods and the presence of such a strip is detected by the coil system for field excitation and for pick-up of the magnetic oscillations after every excitation time span.

When a strip of amorphous magnetostrictive material is exposed to a magnetic field, then the magnetostriction causes a change in the length of the strip. This dependency, however, is not linear but is dependent on the dimensions of the strip and on the size of the magnetic field. When the magnetic field is boosted in equal steps given a specific strip, then one finds that only small changes in length initially occur, then the changes in length become greater with increasing steps of the magnetization boost, and then no further change in length ensues upon the occurrence of saturation, despite a magnetic field that continues to be boosted in steps.

The effect of this property is that such a strip can be excited to mechanical oscillations when it is exposed to a pre-magnetization field whose size results in a great change in length given a uniform change of the magnetic field. A further effect of the change in length ensuing due to the magnetic field is that the length of the strip changes in this region without a tensile stress acting on the strip.

The modulus of elasticity of the material is the determining factor for the resonant frequency of the oscillation given mechanical oscillation of a strip. The force required for a specific change in length becomes greater and the resonant frequency of the oscillating strip becomes higher, as the modulus of elasticity increases. An additional change in length, however, ensues due to the influence of the magnetic field without a force being necessary. The material thus acts as though it had a lower mechanical modulus of elasticity than it really has.

The result is that the resonant frequency given excitation by an alternating magnetic field becomes lower with increasing pre-magnetization than it is without pre-magnetization. A strip that oscillates at a specific resonant frequency with high signal amplitude with a given pre-magnetization will oscillate substantially less given excitation with the same frequency when the pre-magnetization field is removed, because the resonant frequency is thereby boosted and the exciting frequency and the resonant frequency no longer coincide.

The removal of the pre-magnetization field also results in a change of the magnetic field now only results in a relatively slight change in the length of the strip, so that the signal height also significantly decreases without pre-magnetization field.

Together, the two factors cause a mechanical oscillation of the strip to be suppressed upon removal of the pre-magnetization field. It is thus possible to deactivate an anti-theft security strip composed of this material by removing the pre-magnetization field.

This is achieved in the case of anti-theft security strips by, for example, a demagnetizing magnet connected to the strip. In other systems wherein the pre-magnetization field is in part generated by a coil in the examination area, the oscillation can be suppressed by turning off this pre-magnetization field.

Despite these relationships, a reliable deactivation within the same time required for a reliable response cannot always be achieved with known pre-magnetization techniques. The reason for this is that the earth's magnetic field also acts on the monitoring strip in addition to the pre-magnetization field, and build-up of tolerances that influence the resonant frequency must be taken into account given mass production of monitoring strips.

When the monitoring strip is rotated in the earth's magnetic field, this will increase the pre-magnetization at one end region or strip-half and decrease it in the other. This results in a natural fluctuation of the resonant frequency. The monitoring apparatus, however, must then be set such that these fluctuations of the resonant frequency do not lead to the failure to generate an alarm under proper circumstances, while still insuring that the resonant frequency changes to such an extent upon removal of the pre-magnetization field is certain that an alarm can no longer be triggered.

SUMMARY OF THE INVENTION

It is an object of the present invention to specify an alloy for employment as monitoring strip in monitoring or identification systems that responds reliably under true alarm-causing conditions but which can be reliably deactivated. This requires an alloy which exhibits only a relatively slight change in its resonant frequency caused by superimposing the earth's magnetic field on the pre-magnetization field, but exhibits a considerable change in its resonant frequency when the pre-magnetization field is removed.

The above object is achieved in accordance with the principles of the present invention in an amorphous alloy having the formula $Fe_a\ Co_b\ Ni_c\ Si_x\ B_y\ M_z$ employed as monitoring strips for mechanically oscillating tags, for example for anti-theft protection, together with a source of a pre-magnetization field in which the strip is disposed so as to place the strip in an activated state. In the formula, M denotes one or more elements of groups IV through VII of the periodic table, including C, Ge and P, and the constituents in at % meet the following conditions: a lies between 20 and 74, b lies between 4 and 23, c lies between 5 and 50, with the criterion that b+c>14, x lies between 0 and 10, y lies between 10 and 20, and z<5 with the sum x+y+z being between 12 and 21. These alloys have a resonant frequency associated therewith and when passed through an alternating field whose alternation frequency coincides with the resonant frequency, a pulse having a signal amplitude is produced. These alloys can be deactivated by removing the pre-magnetization field, which causes a change in the resonant frequency and the resulting signal amplitude. These alloys exhibit a change in resonant frequency and signal amplitude due to changes in the orientation of the tag in the earth's magnetic field which is smaller than the change occurring upon removal of the pre-magnetization field, so that the tag can be reliably deactivated.

In addition, the invention achieves other objects that are important, in particular, for monitoring systems for anti-theft protection. In an anti-theft monitoring system that is based on mechanical resonance, the monitoring strip is deactivated by demagnetizing a magnet attached to the strip. Monitoring strips which are thus connected to the goods, however, could undesirably trigger a false alarm in a monitoring zone operating according to the harmonics method. In such monitoring systems, monitoring strips are discovered in an examination field by evaluating the harmonics of the exciting alternating field that they generate.

It is important that goods with magneto-elastically excitable tags that have already been deactivated do not trigger an alarm. This is achieved with the inventive tags by setting a flat magnetization loop without remanence discontinuities by a thermal treatment in a transverse magnetic field,

DESCRIPTION OF THE PREFERRED EMBODIMENTS

Investigations of known amorphous alloys that are used for tags which resonate in a magnetic field were undertaken. The following were measured: the change of the resonant frequency as a consequence of the earth's magnetic field Δfr(H) in kHz given a change in the position of the monitoring strip; the frequency change fr(0)−fr(H) in kHz that arises when the resonant frequency is measured with and then without pre-magnetization field; the signal voltage U in mV that is a criterion for the amplitude of the signal to be evaluated; and the decay time $t_R$ in ms, i.e. the time that passes after excitation of a monitoring strip of the alloy with resonant frequency until the signal induced by the mechanical oscillation has decayed to one-tenth of the original value. A field strength in the range H=400–800 A/m, as is also typically used in this context, was employed for the pre-magnetizing magnetic field in the exemplary embodiments. The positional change of the monitoring strip in the earth's magnetic field was simulated by a reduction of or boost in this preomagnetizing field by 40 A/m (amount of the earth's field strength). Further, a consecutive test number (No.) for the individual exemplary alloys and the cobalt content in weight % are recited in the table.

The following Table 1 contains values for two different, known alloys. The alloy under tests Nos. 1 and 2 is known from the aforementioned PCT Application WO 90/03652, whereas the alloy under test No.3 is mentioned in German Utility Model 9412456. The tests with respect to Nos. 1 and 2 were undertaken with the same alloy. The alloy in the manufactured state was investigated as test No. 1 and the alloy under Nos. 2 and 3 was investigated after a thermal treatment with which a linear, flat loop was set.

TABLE 1

| No. | Composition (at %) | Co Wt. % | Δfr(H) (kHz) | fr(0)−fr(H) (kHz) | U (mV) | $t_R$ (ms) |
|---|---|---|---|---|---|---|
| 1 | Fe-40 Ni-38-Mo-4 B-18 | — | 0.34–0.72 | 1.94–3.51 | 150 | 4 |
| 2 | Fe-40 Ni-38-Mo4 B-18 | — | 1.04–1.65 | 6.55–6.84 | 20 | 1.3 |
| 3 | Fe-39.5 Co-39.5 Si-6 B-15 | 47.9 | 0.79–1.44 | 2.43–4.92 | 220 | 5.2 |

One can see that test No.1 has a variation of the resonant frequency due to the earth's magnetic field Δfr below 1 kHz dependent on the specimen investigated, whereas the change in the resonant frequency given removal or addition of a pre-magnetization field (fr(0)−fr(H)) exhibits a change in the resonant frequency of more than 1.94. The signal amplitude at 150 mV, and the oscillation duration also suffice for utilization in monitoring systems with mechanically oscillating tags.

The disadvantage of this alloy, however, is that discontinuous changes in remanence occur in the magnetization loop, which can trigger a false alarm when a security tag having such a monitoring strip is conducted through a monitoring field of an anti-theft security system that exploits the harmonics generated by an alternating field for detection.

The values recited under No. 2 arise with the same alloy after a thermal treatment for achieving a flat, linear loop. One can see that the dependency on the earth's magnetic field has become significantly greater since the fluctuations in the resonant frequency given a change in position of the strip lie above 1 kHz. Even though the separation from the change in the resonant frequency given removal of the pre-magnetization field, at over 6 kHz, is adequate such a band is not very well suited for mechanically oscillating tags—especially because of the low signal amplitude of 20 mV and the short decay time of the oscillating strip.

Like the alloy under No. 1, the alloy under No. 3 of Table 1 again exhibits an adequately low fluctuation of the resonant frequency dependent on the earth's magnetic field and also lies in a good usable range in terms of the other values, namely the change in the resonant frequency given removal of the pre-magnetization field signal voltage and the decay time. The replacement of nickel with cobalt, however, has resulted in a cobalt content of 47.9 by weight percent in the alloy, so that this alloy presents economic disadvantages for mass employment because of the relatively high price of cobalt.

It was inventively recognized that amorphous alloys that contain iron as well as cobalt and nickel and whose metalloid part (Si, B) does not exceed certain values can have the following properties:

1. a high signal amplitude and a long lasting signal after the exciting field is turned off;
2. a linear, flat characteristic of the magnetization loop in order to avoid false alarms in other security systems;
3. a low dependency of the resonant frequency on the pre-magnetizing field strength (earth's field);
4. a reliable deactivation of the mechanical oscillator upon removal of the pre-magnetizing field due to adequate change of the resonant frequency and signal amplitude;

5. low raw material costs due to an optimally low Co content;
6. a ductility after thermal treatment that allows a bending of the strip to a diameter of less than 2 mm without the signal amplitude being subsequently significantly deteriorated.

Examples of inventive alloys are recited below in Table 2 under Nos. 4 through 26:

TABLE 2

| No. | Composition (at %) | Co Wt. % | Δfr(H) (kHz) | fr(0)–fr(H) (kHz) | U (mV) | $t_R$ (ms) |
|---|---|---|---|---|---|---|
| 4 | Fe-49 Co-6 Ni-27 Si-2 B-16 | 7.2 | 0.78–1.39 | 2.41–5.16 | 151 | 5.3 |
| 5 | Fe-47 Co-10 Ni-25 Si-2 B-16 | 12.0 | 0.69–1.22 | 2.11–4.52 | 187 | 6.0 |
| 6 | Fe-41 Co-10 Ni-31 Si-2 B-16 | 12.0 | 0.51–0.93 | 1.54–3.31 | 137 | 6.2 |
| 7 | Fe-36 Co-10 Ni-36 Si-2 B-16 | 11.9 | 0.58–1.05 | 1.81–3.88 | 172 | 6.6 |
| 8 | Fe-31 Co-10 Ni-41 Si-2 B-16 | [13.7]*11.9* | 0.65–1.17 | 2.01–4.31 | 185 | 5.6 |
| 9 | Fe-51.5 Co-11.5 Ni-20 Si-1 B-16 | 13.7 | 0.56–1.02 | 1.72–3.70 | 157 | 6.0 |
| 10 | Fe-41.5 Co-11.5 Ni-30 Si-1 B-16 | 13.7 | 0.41–0.74 | 1.25–2.69 | 129 | 10.2 |
| 11 | Fe-49.5 Co-13 Ni-20 Si-1.5 B-16 | 15.6 | 0.53–0.94 | 1.57–3.41 | 173 | 9.2 |
| 12 | Fe-44.5 Co-13 Ni-25 Si-1.5 B-16 | 15.5 | 0.47–0.83 | 1.39–3.01 | 158 | 7.9 |
| 13 | Fe-39.5 Co-13 Ni-30 Si-1.5 B-16 | 15.5 | 0.41–0.74 | 1.23–2.66 | 139 | 8.5 |
| 14 | Fe-34.5 Co-13 [Bi] *Ni*-35 Si-1.5 B-16 | 15.4 | 0.38–0.71 | 1.15–2.43 | 120 | 9.9 |
| 15 | Fe-29.5 Co-13 Ni-40 Si-1.5 B-16 | 15.4 | 0.45–0.80 | 1.36–2.93 | 141 | 7.4 |
| 16 | Fe-28 Co-13 Ni-41 Si-2 B-16 | 15.4 | 0.59–1.06 | 1.79–3.86 | 167 | 6.4 |
| 17 | Fe-44 Co-16 Ni-22 Si-2 B-16 | 19.2 | 0.39–0.72 | 1.16–2.51 | 145 | 9.9 |
| 18 | Fe-40 Co-16 Ni-26 Si-2 B-16 | 19.1 | 0.44–0.80 | 1.34–2.89 | 160 | 9.7 |
| 19 | Fe-28 Co-16 Ni-38 Si-2 B-16 | 19.0 | 0.45–0.81 | 1.32–2.87 | 139 | 7.3 |
| 20 | Fe-40.5 Co-20.5 Ni-20 Si-3 B-16 | 24.6 | 0.38–0.71 | 1.12–2.46 | 147 | 10.3 |
| 21 | Fe-51 Co-21 Ni-10 Si-2 B-16 | 25.2 | 0.58–1.03 | 1.75–3.75 | 203 | 7.7 |
| 22 | Fe-46 Co-21 Ni-15 Si-2 B-16 | 25.2 | 0.43–0.78 | 1.30–2.83 | 123 | 7.1 |
| 23 | Fe-43 Co-21 Ni-18 Si-2 B-16 | 25.1 | 0.37–0.68 | 1.10–2.38 | 115 | 9.0 |
| 24 | Fe-41 Co-21 Ni-20 Si-2 B-16 | 25.1 | 0.31–0.59 | 0.93–2.00 | 100 | 11.9 |
| 25 | Fe-41 Co-21 Ni-20 Si-1 B-17 | 25.2 | 0.31–0.56 | 0.89–1.94 | 108 | 12.1 |
| 26 | Fe-40.5 Co-21 Ni-20 Si-2.5 B-16 | [26.2]*25.2* | 0.36–0.67 | 1.13–2.40 | 103 | 9.8 |

The exemplary alloys were subjected to a thermal treatment in a magnetic transverse field for setting the flat, linear loop. Typical annealing temperatures were from 280° through 440° C. The annealing times were in the range from a few seconds through several hours. The exact thermal treatment causes a typical range of variation for the quantities Δfr(H) and fr(H)–fr(0) that is indicated in the above table. The investigations were implemented for strips having a length of 40 mm. The typically resonant frequencies were in the range of 50–60 kHz.

All of the cited examples have a linear loop, a high signal amplitude above 100 mV, a decay time of a few ms, and a frequency scatter Δfr<1 kHz as well as an adequately high frequency change of fr(0)–fr(H)>1 kHz after demagnetization can be achieved. After thermal treatment, further, the alloys have the ductile behavior necessary for further processing. Examples 4–17 are especially advantageous since they have a Co part clearly below 20% by weight and thus achieve the desired properties with a low cost of raw materials.

For illustration, the following Table 3 shows a few compositions that do not achieve the object of the invention:

TABLE 3

| No. | Composition (at %) | Co Wt. % | Δfr(H) (kHz) | fr(0)–fr(H) (kHz) | U (mV) | $t_R$ (ms) |
|---|---|---|---|---|---|---|
| 27 | Fe-41.4 Ni-41.5 Si-1 B-16 | — | 1.38–2.33 | 4.63–9.68 | 144 | 2.4 |
| 28 | Fe-52 Ni-30 Si-2 B-16 | — | 1.25–2.19 | 4.14–8.72 | 192 | 2.9 |
| 29 | Fe-57 Ni-25 Si-2 B-16 | — | 1.49–2.56 | 5.04–10.52 | 203 | 2.8 |
| 30 | Fe-65 Co-18 Si-1 B-16 | 21.7 | 1.42–2.39 | 4.72–9.82 | 178 | 2.8 |
| 31 | Fe-61.5 Co-21.5 Si-1 B-16 | 25.8 | 0.98–1.76 | 3.12–6.64 | 195 | 3.9 |
| 32 | Fe-47.4 Co-31.6 Si-2 B-19 | 39.0 | 1.01–1.75 | 3.31–6.93 | 197 | 4.1 |
| 33 | Fe-24 Co-55 Si-6 B-15 | 66.0 | 0.47–0.84 | 1.45–3.12 | 197 | 7.9 |
| 34 | Fe-29 Co-27 Ni-27S Si-1 B-16 | 31.8 | 0.10–0.19 | 0.26–0.58 | 37 | 17.1 |
| 35 | Fe-27 Co-27 Ni-27 Si-3 B-16 | 32.2 | 0.16–0.31 | 0.46–1.02 | 65 | 23.7 |

Nos. 27–32 have a Co content that is clearly reduced compared to the prior art (No. 3) but usually exhibit a frequency scatter Δfr(H) clearly above 1 kHz.

No. 33 in fact exhibits a slight frequency scatter, but this was only possible by increasing the Co content compared to the prior art. The increased costs of the alloy are accordingly disadvantageous.

Examples 34 and 35 comprise a lower Co content and less frequency scatter compared to the prior art (No. 3), however, the frequency change after demagnetization is too small (<1 kHz). The low signal amplitude is also disadvantageous.

Alloys are thus especially suitable that, for example due to a thermal treatment, exhibit a Δfr of less than 1 kHz, preferably less than 0.8 kHz, and a change of the resonant frequency fr(0)–fr(H)>1 kHz, preferably 1.2 kHz. The thermal treatment for setting a flat loop preferably occurs at a temperature from 250° through 450° C. for a time from 2 through 60 seconds. The short treatment time makes it possible for the ribbon to be thermally treated in throughput production with the use of a throughput furnace before being wound into reels. Following the thermal treatment in the throughput furnace, the ribbon can be immediately cut to the desired length for the monitoring strip.

Typical dimensions of the strip for the intended application are a length of 30 through 50 mm, a width of 0.5 through 25 mm and a thickness of the amorphous ribbon in the range from 15 through 40 $\mu$m. The decay time should be longer than 3 msec, and the pre-magnetization field typically lies in a range from 400 through 800 A/m. Advantageous resonant frequencies lie in a range from 50 to 60 kHz.

Although modifications and changes may be suggested by those skilled in the art, it is the intention of the inventor to embody within the patent warranted hereon all changes and modifications as reasonably and properly come within the scope of his contribution to the art.

I claim as my invention:

1. In a tag having magneto-elastically excitable strip for use with a source of a pre-magnetization field, for activating said tag, and an alternating magnetic field in a mechanical resonance monitoring system, the improvement of said strip comprising an amorphous, magnetostrictive alloy having constituents satisfying the formula $$Fe_a\ [CO_b]\ Co_b\ Ni_c\ Si_x\ B_y\ M_z$$

wherein M denotes at least one element of groups IV through VII of the periodic table, including C, Ge and P, and the constituents in at % meet the following conditions:

a lies between 20 and 74, b lies between 4 and 23, c lies between 5 and 50, b+c>14, x lies between 0 and 10, y lies between 10 and 20, z±5, and with x+y+z lies between 12 and [2] *21*; and said amorphous, magnetostrictive alloy having a resonant frequency associated therewith and when passed through an alternating magnetic field having an alternation frequency coinciding with said resonant frequency, said strip producing a pulse having a signal amplitude, and said amorphous, magnetostrictive alloy exhibiting a change in resonant frequency [and signal amplitude] due to a change in orientation of the tag in the earth's magnetic field which is [smaller than] *less than 1 kHz and* a change [occurring] *in resonant frequency* upon removal of the pre-magnetization field to deactivate said tag *which is greater than 1 kHz, and a change in said signal amplitude due to said change in orientation of the tag in the earth's magnetic field which is smaller than a change upon removal of the pre-magnetization field to deactivate said tag, and said strip having a flat magnetization loop produced by a thermal treatment in a transverse magnetic field at a temperature in a range from 250° C. to through 450° C. for a duration of from 2 through 60 seconds.*

2. The improvement of claim 1 wherein:

a lies between 20 and 73, b lies between 4 and 16, c lies between 10 and 50, and x+y+z lies between 13 and 20.

3. The improvement of claim 1 wherein:

a lies between 23 and 68, b lies between 4 and 13, c lies between 15 and 45, and x+y+z lies between 13 and 19.

4. The improvement of claim 1 wherein said strip has a flat magnetization loop for causing said change in resonant frequency and signal amplitude due to changes in the orientation of the tag in the earth's magnetic field to be smaller than the change occurring upon removal of the pre-magnetization field.

5. The improvement of claim 4 wherein said flat magnetization loop proceeds substantially linearly into a saturation region of said strip.

[6. The improvement of claim 1, wherein said alloy exhibits a change in resonant frequency caused by changes in the orientation of the tag in the earth's magnetic field which is less than 1 kHz, and wherein said tag exhibits a change in resonant frequency upon removal of said pre-magnetization field which is greater than 1 kHz.]

7. The improvement of claim 1 wherein said strip has a length in a range from 30 through 50 mm, a width in a range from 0.5 through 25 mm, and a thickness in a range from 15 through 40 $\mu$m.

8. The improvement of claim 7 wherein said strip comprises a piece cut from a cast ribbon of said alloy following a thermal treatment of said ribbon for setting a magnetization loop in said alloy.

9. The improvement of claim 8 wherein said strip has a flexibility permitting said strip to be bent to a bending diameter of [greater] *less* than [or equal to] 2 mm after said thermal treatment without breaking said strip and without altering said change in resonant frequency and signal amplitude.

10. The improvement of claim 1 wherein said strip has a resonant frequency in a range from 50 through 60 kHz.

11. The improvement of claim 1 further comprising a magnet attached to said strip serving as said source of a pre-magnetization field, said magnet producing a pre-magnetization field in a range from 400 through 800 A/m, and said strip having a maximum signal amplitude in said range.

12. The improvement of claim 11 wherein, after said strip passes through said alternating field to place said strip in a resonant state, said strip in said resonant state has a decay time of more than 3 ms.

[13. The improvement of claim 1 wherein said strip has a magnetization loop produced by a thermal treatment in a transverse magnetic field at a temperature in a range from 250° C. through 450° C. for a duration of from 2 through 60 seconds.]

14. The improvement of claim [13] *1* wherein said strip is cut from a ribbon continuously passed through said transverse magnetic field in said temperature range for said duration.

15. The improvement of claim 1 wherein said alloy exhibits a change in resonant frequency due to a change in orientation of the tag in the earth's magnetic field which is less than 0.8 kHz, and wherein said alloy exhibits a change in resonant frequency upon removal of said pre-magnetization field which is greater than 1.2 kHz.

* * * * *